(12) United States Patent
Naeve et al.

(10) Patent No.: US 12,414,236 B2
(45) Date of Patent: Sep. 9, 2025

(54) ELECTRONIC DEVICE WITH CASTELLATED BOARD

(71) Applicant: Infineon Technologies AG, Neubiberg (DE)

(72) Inventors: Tomasz Naeve, Finkenstein (AT); Urban Medic, Logatec (SI); Milad Mostofizadeh, Munich (DE); Petteri Palm, Stein (DE)

(73) Assignee: Infineon Technologies AG, Neubiberg (DE)

( * ) Notice: Subject to any disclaimer, the term of this patent is extended or adjusted under 35 U.S.C. 154(b) by 308 days.

(21) Appl. No.: 17/737,314

(22) Filed: May 5, 2022

(65) Prior Publication Data

US 2022/0377901 A1    Nov. 24, 2022

(30) Foreign Application Priority Data

May 21, 2021   (DE) ...................... 10 2021 113 302.5

(51) Int. Cl.
*H05K 1/18* (2006.01)
*H05K 1/02* (2006.01)

(52) U.S. Cl.
CPC ............. *H05K 1/183* (2013.01); *H05K 1/021* (2013.01); *H05K 1/181* (2013.01); *H05K 1/184* (2013.01); *H05K 2201/09145* (2013.01)

(58) Field of Classification Search
CPC ........ H05K 1/02; H05K 1/021; H05K 1/0203; H05K 1/0213; H05K 1/11; H05K 1/14; H05K 1/142; H05K 1/18; H05K 1/183–187; H05K 2201/09145; H05K 2201/10416

USPC ................. 361/767–795, 803; 257/660–690
See application file for complete search history.

(56) References Cited

U.S. PATENT DOCUMENTS

| | | | | |
|---|---|---|---|---|
| 4,821,007 A * | 4/1989 | Fields | .................... | H05K 1/141 |
| | | | | 29/830 |
| 5,949,294 A * | 9/1999 | Kondo | ................. | H03H 9/1021 |
| | | | | 361/728 |
| 6,229,404 B1 * | 5/2001 | Hatanaka | ................. | H03H 9/08 |
| | | | | 310/318 |
| 6,462,950 B1 * | 10/2002 | Pohjonen | ............ | H01L 23/3677 |
| | | | | 257/713 |
| 6,549,409 B1 * | 4/2003 | Saxelby, Jr. | ......... | H05K 1/0203 |
| | | | | 174/548 |
| 6,700,448 B1 * | 3/2004 | Knecht | ................... | H05K 1/144 |
| | | | | 331/158 |
| 6,862,190 B2 * | 3/2005 | Olzak | .................... | H05K 1/141 |
| | | | | 174/262 |
| 7,132,737 B2 * | 11/2006 | Miyazaki | ............. | H03H 9/0552 |
| | | | | 257/E23.044 |
| 8,264,851 B2 * | 9/2012 | Jafari | ..................... | H05K 1/141 |
| | | | | 361/784 |
| 8,446,002 B2 * | 5/2013 | Shibuta | ............. | H01L 27/14618 |
| | | | | 257/466 |

(Continued)

*Primary Examiner* — Tuan T Dinh
(74) *Attorney, Agent, or Firm* — Dicke, Billig & Czaja, PLLC

(57) ABSTRACT

An electronic device is disclosed. In one example, the electronic device comprises a carrier board, a metal inlay having a cavity and being arranged in the carrier board. At least one electronic component is arranged at least partially in the cavity and embedded in the carrier board. Electric contacts are located at a castellated edge of the carrier board.

18 Claims, 5 Drawing Sheets

(56) References Cited

U.S. PATENT DOCUMENTS

| | | | |
|---|---|---|---|
| 8,664,538 B2* | 3/2014 | Kim | H01L 21/4846 |
| | | | 29/832 |
| 9,538,636 B1 | 1/2017 | Weigand et al. | |
| 9,548,717 B2* | 1/2017 | Takase | H03H 9/08 |
| 2003/0080819 A1* | 5/2003 | Jiles | H05K 1/183 |
| | | | 331/176 |
| 2003/0232462 A1* | 12/2003 | Poo | H01L 23/49805 |
| | | | 438/117 |
| 2006/0279367 A1* | 12/2006 | Knecht | H03B 5/32 |
| | | | 331/107 A |
| 2008/0116981 A1* | 5/2008 | Jacobson | H05K 1/0243 |
| | | | 331/74 |
| 2009/0168363 A1 | 7/2009 | Clayton et al. | |
| 2010/0102436 A1 | 4/2010 | Eng et al. | |
| 2010/0140777 A1 | 6/2010 | Michaels et al. | |
| 2014/0070365 A1 | 3/2014 | Viswanathan et al. | |
| 2017/0330827 A1* | 11/2017 | Rohrmoser | H01L 23/552 |
| 2018/0069210 A1* | 3/2018 | Bohney | H05K 1/117 |
| 2018/0241285 A1* | 8/2018 | Sasaki | H05K 1/0204 |

\* cited by examiner

ELECTRONIC DEVICE WITH CASTELLATED BOARD

CROSS-REFERENCE TO RELATED APPLICATION

This Utility Patent Application claims priority to German Patent Application No. 10 2021 113 302.5, filed May 21, 2021, which is incorporated herein by reference.

BACKGROUND

Technical Field

Various embodiments relate generally to electronic devices, and an electronic arrangement.

Description of the Related Art

Packages may be denoted as usually encapsulated electronic components with electrical connects extending out of the encapsulant. For example, packages may be connected to an electronic periphery, for instance mounted on a printed circuit board and/or connected with a heat sink, and may be connected via connectors to a larger system.

Packaging cost is an important driver for the industry. Related with this are performance, dimensions and reliability. The different packaging solutions are manifold and have to address the needs of a specific application.

It is also known to surface mount and/or embed electronic components on and/or in carrier boards, such as a printed circuit board.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

Figure 1:
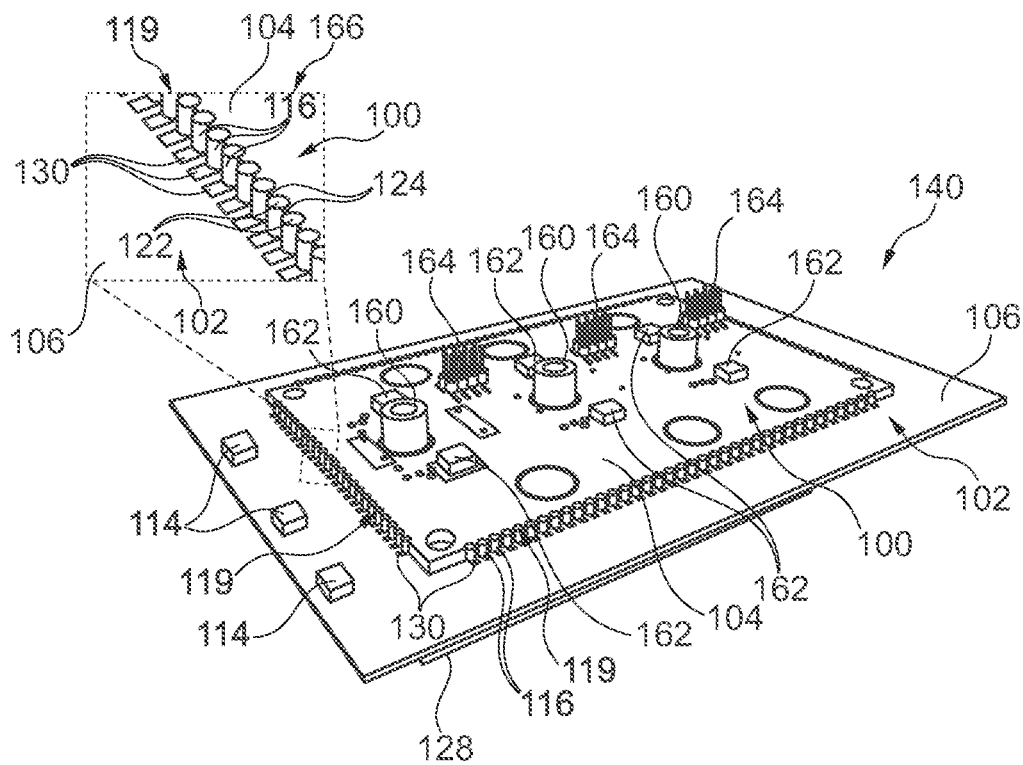
FIG. 1 illustrates a three-dimensional view of an electronic arrangement according to an exemplary embodiment.

There is a need for a compact electronic device with high reliability and performance.

According to an exemplary embodiment of a first aspect of the disclosure, an electronic device is provided, wherein the electronic device comprises a carrier board, a metal inlay having a cavity and being arranged in the carrier board, at least one electronic component arranged at least partially in the cavity and embedded in the carrier board, and electric contacts at a castellated edge of the carrier board.

According to an exemplary embodiment of a second aspect of the disclosure, an electronic device is provided, wherein the electronic device comprises a carrier board, at least one electronic component embedded in and/or mounted on the carrier board, and electric contacts at a castellated edge of the carrier board, wherein at least part of the castellated edge is arranged along at least part of an inner circumference of an opening in the carrier board.

According to yet another exemplary embodiment, an electronic arrangement is provided which comprises a first electronic device and a second electronic device, wherein the first electronic device and the second electronic device are stacked on each other, and wherein one or both of the first electronic device and the second electronic device is or are configured as an electronic device having the above-mentioned features.

According to an exemplary embodiment of the first aspect of the disclosure, one or more electronic components (such as at least one power semiconductor chip) may be accommodated in a cavity of a metal inlay being embedded, in turn, in a carrier board, wherein electric contacts at a castellated edge of the carrier board may establish an electric connection between the electronic device (in particular between the electronic component(s) embedded therein) and an electronic periphery, such as a stacked further electronic device of an electronic arrangement. With such a design, the at least one electronic component may be mounted in a reliable and compact way within the carrier board and mechanically protected by the metal inlay. At the same time, the metal inlay may contribute to an electric connection of the at least one electronic component and/or to a removal of heat created by the electronic component(s) during operation of the electronic device or arrangement. By providing electric contacts of a corresponding carrier board at a castellated edge, a compact design of electronic device and arrangement may be promoted, and short and reliable electrical connections may be established between stacked electronic devices of an electronic arrangement. By the mentioned short connections, signal losses and heat generation may be efficiently suppressed, which may result in excellent mechanical, electric and thermal reliability. The provision of a castellated edge with electric contacts may render a number of SMD-type connectors smaller and may reduce a size of the respective carrier board, thereby contributing to the compactness of the electronic device.

According to an exemplary embodiment of the second aspect of the disclosure, a carrier board with embedded and/or surface mounted one or more electronic components and with one or more interior castellated edges for establishing an electric connection via electric contacts arranged at such at least one interior castellated edge may be provided. Hence, an electric connection with extremely short and flexibly selectable current paths may be created between the carrier board (and in particular between the at least one electronic component mounted therein and/or thereon) on the one hand and an electric periphery (such as a stacked other carrier board) on the other hand. For example, an opening (such as a through hole) may be formed in any desired region of such a carrier board and may be delimited partially or entirely by a castellated edge having electric contacts. For connecting such electric contacts of the assigned carrier board to electric traces or pads of another stacked carrier board, it may be sufficient to provide an electrically conductive contact structure (such as a solder material) at an interface between the interior castellated edge and the traces or pads. Advantageously, one or more interior castellated edges may be formed in any desired region of a carrier board (for instance in a functionally unused region of a carrier board) for keeping electric connection paths short and for keeping the assigned carrier board small. By providing electric contacts of such a carrier board as an interior castellated edge, a particularly compact design of electronic device and arrangement may be promoted, and short and reliable electrical connections may be established between stacked electronic devices of an electronic arrangement. By the mentioned very short and flexibly definable connections, signal losses and heat generation may be kept very low, which may promote an excellent performance and reliability.

In the following, further exemplary embodiments of the electronic devices, and the electronic arrangement will be explained.

In the context of the present application, the term "carrier board" may particularly denote a support structure which serves as a mechanical support for one or more components to be mounted therein and/or thereon. In other words, the carrier board may fulfil a mechanical support function. Additionally or alternatively, a carrier board may also fulfill an electrical connection function. A carrier board may comprise or consist of a single part, multiple parts joined via encapsulation or other package components, or a subassembly of carrier boards. Preferably, a carrier parts may be a flat sheet-shaped body. In particular, a carrier board may be or may comprise a plate-shaped electronic mounting base, such as a printed circuit board (PCB).

In the context of the present application, the term "metal inlay" may particularly denote a metallic body arranged in an interior of a carrier board and composed of a single part or multiple parts. In particular, the metal inlay may be a sheet-shaped body comprising or consisting of a metallic material such as copper or aluminum. For example, a metal inlay may be or comprise a leadframe, a metal block (for instance made of copper), etc.

In the context of the present application, the term "cavity" may denote an opening in the metal inlay functioning as an accommodation volume for accommodating an electronic component thereof. In particular, a cavity may be a recess or blind hole being delimited at a bottom side and laterally by metallic material of the metal inlay. It is however also possible that the cavity is a through hole in the metal inlay accommodating an electronic component partially or entirely.

In the context of the present application, the term "component" may in particular encompass a member or a body integrated within and/or assembled on a carrier board. For instance, such a component may be an electronic component or a component without electronic functionality, for example a cooling block (for instance made of metal) or even an electrically insulating body (for instance a block made of a ceramic).

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof The electronic component may be a naked die or may be already packaged or encapsulated. Semiconductor chips implemented according to exemplary embodiments may be formed for example in silicon technology, gallium nitride technology, silicon carbide technology, etc. It is however also possible that an electronic component is a passive component, such as a capacitor, an inductor, and/or an ohmic resistance.

In the context of the present application, the term "electric contacts" may particularly denote electrically conductive structures, such as horizontally and/or vertically extending traces or pads, which may be configured for establishing electric connections within a carrier board and/or between carrier boards.

In the context of the present application, the term "castellated edge" may particularly denote a slanted or vertical edge of a carrier board contributing to a delimitation of a carrier board and comprising a surface profile with alternating lateral elevations and valleys, wherein electric contacts may be formed at various subsections of the surface profile. In particular, a castellated edge may be or may comprise an exterior castellated edge forming part of an exterior boundary of a respective carrier board. For instance, such an exterior castellated edge may be arranged along part or along an entire circumference or perimeter of the carrier board. Additionally or alternatively, a castellated edge may be or may comprise an interior castellated edge forming part of an interior boundary of a respective carrier board and being surrounded fully circumferentially by material of the carrier board. For instance, such an interior castellated edge may be arranged along part or along an entire circumference or perimeter delimiting an opening (such as a through hole or a blind hole) in the carrier board.

In the context of the present application, the term "electronic devices stacked on each other" may particularly denote two or more electronic devices mounted on top of each other, in particular in a vertical direction. In particular, one, some or all of said electronic devices may be flat and board-shaped, optionally comprising one or more surface mounted components. An electric connection between stacked electronic devices may be established by an electrically conductive connection medium, such as a solder material, a sinter material, and/or an adhesive (in particular an electrically conductive adhesive).

In an embodiment, at least part of the castellated edge is arranged along at least part of an outer circumference of the carrier board. The provision of electric contacts at a castellated edge at an exterior lateral surface of the respective carrier board may provide reliable electric connections in a space-saving manner. Additionally or alternatively to one or more exterior castellated edges, at least part of the castellated edge may be arranged along at least part of an inner circumference of an opening in the carrier board. The provision of at least one exterior and/or at least one interior castellated edge of a carrier board may enable a compact electric connection with multiple electric contacts.

In an embodiment, the castellated edge comprises a plurality of alternating lateral indentations and lateral protrusions. Such an alternating (for instance undulating or wave-shaped) sequence of indentations and protrusions may be formed at a slanted or even vertical exterior or interior sidewall of the respective carrier board.

In an embodiment, the indentations comprise or are defined by a curved vertical surface area, in particular a concavely curved vertical surface area of the carrier board. This design may promote a flow of solder (or another electrically conductive contact structure) selectively into the indentations. This may result in a proper wetting of the electric contacts at the indentations with flowable material of the electrically conductive contact structure, and may thus allow to form reliable electric connections. Descriptively speaking, capillary effects may promote a self-sufficient flow of material of the electrically conductive contact structure to desired locations. The indentations may have a metallization at their entire surface, or at only a sub portion of their surface. For instance, it is also possible that an indentation has a surface comprising at least one passive surface portion and at least one metallized surface portion.

In an embodiment, the protrusions comprise or are delimited by a planar vertical surface area. However, other designs are possible as well. In particular, it is possible that a respective protrusion comprises at least one planar and/or at least one non-planar (for instance convex and/or concave) surface or surface portion.

In an embodiment, the electric contacts are formed at the lateral indentations only. Flowable material of the electrically conductive contact structure flowing into the indentations may then automatically wet the electric contacts for establishing an electric coupling.

In an embodiment, the lateral protrusions are free of the electric contacts, for instance may be dielectric. Descriptively speaking, the protrusions may spatially separate and therefore electrically decouple different electric contacts at neighboured indentations from each other in a reliable way. In different embodiments, the protrusions may have a completely dielectric surface, or a partially dielectric and partially metallized surface. For instance, a metallization also in a region of a protrusion may improve stabilization. However, such metallization regions of the protrusions may be electrically insulated (in particular separated and/or passivated) from adjacent indentations.

In an embodiment, at least part of the electric contacts is formed on a vertical surface portion of the castellated edge. In particular, vertical surface portions of the castellated edge may be covered or lined with a metallic coating creating the electric contacts.

In an embodiment, another part of the electric contacts is formed on only one or on both opposing horizontal surface portions of the castellated edge directly next to a respective indentation. Hence, a bottom and/or top surface of the respective carrier board adjacent to a respective indentation of the castellated edge may or may not be provided with a metallic coating forming the respective electric contact.

In an embodiment, the at least one electronic component comprises at least one of a group consisting of at least one power component (in particular at least one semiconductor power chip), at least one active component (in particular at least one transistor chip), and at least one passive component (in particular at least one capacitor component). For instance, such an electric component being surface mounted on or embedded in the respective carrier board may be electrically coupled to electric contacts at the castellated edge, and may thus be electrically connected to electric contacts and optionally also components of another stacked carrier board of another electronic device.

In an embodiment, the electronic device is configured for providing or contributing to an electronic inverter function (in particular a three-phase inverter function). Descriptively speaking, such an inverter may provide electric energy to an electric engine. For this purpose, the electronic inverter may comprise a plurality of electronic components configured as transistor switches (in particular embodied as field effect transistor chips) cooperating for converting a direct current (DC) to an alternating current (AC) to be supplied to an AC motor. For instance, three pairs of transistor switches of the electronic device may provide a supply current to a three-phase alternating current electric engine.

In an embodiment, the electric contacts at the castellated edge are located substantially at the same vertical level as the carrier board. Hence, a flat carrier board may extend substantially within a plane in which also the electric contacts are located in a coplanar way. This simplifies the electric connection between stacked carrier boards by the electric contacts at the castellated edge of one carrier board cooperating with planar electrically conductive traces or pads of the other carrier board and an electrically conductive connection structure in between.

In an embodiment, the carrier board is a printed circuit board (PCB), in particular one of an FR4-based printed circuit board and an Insulated Metal Substrate (IMS)-based printed circuit board. An FR4-based printed circuit board may comprise a dielectric matrix which includes epoxy resin and glass fibers. An Insulated Metal Substrate may comprise a metal baseplate (aluminum may be used because of its low density) covered by a thin layer of dielectric (for instance an epoxy-based layer) and a layer of metal (in particular copper).

In an embodiment, the electronic arrangement comprises an electrically conductive contact structure electrically coupling the electric contacts at the castellated edge, in particular with electrically conductive traces or pads of another carrier board. In particular, the electrically conductive contact structure may create an electric connection between the electric contacts at the castellated edge of one carrier board and electric contacts of the other carrier board stacked with the previously mentioned carrier board. It is also possible that the electrically conductive contact structure electrically connects at least one electronic component of one electronic device via the electric contacts at the castellated edge with another electronic device, for instance with at least one electronic component thereof.

In an embodiment, the electrically conductive contact structure is a solder structure. Hence, the connection medium may for instance be a solder structure, in particular for diffusion soldering. Also a solder paste may be used, for instance in terms of reflow soldering. Alternatively, a sinter structure (for instance comprising silver sinter material), or an adhesive (in particular an electrically conductive glue) may be used.

In an embodiment, the electronic arrangement comprises a cooling unit, for example a heat sink, mounted on the first electronic device (which may comprise heat generating power semiconductor chips). Thus, the electronic arrangement may comprise a cooling body, in particular a heat sink, being physically connected with the first electronic device, in particular with the carrier board thereof. Thus, the carrier board of the first electronic device (preferably the electronic device having embedded at least one electronic component, which may be a power semiconductor chip) may be connected with such a heat sink or any other kind of cooling unit (for instance a gas or liquid cooling unit). For instance, such a heat sink may comprise a thermally conductive plate (for instance a metal plate) which may be connected to the carrier board of the first electronic device. A plurality of cooling fins may extend from the thermally conductive plate for promoting heat transfer from the first electronic device to an environment. The cooling body and the carrier board may for example be connected by an electrically conductive connection medium, such as a solder material.

In an embodiment, the cooling unit (for example heat sink) is mounted on the first electronic device without physical contact with the electric contacts at the castellated edge of the first electronic device. Hence, the electric path along which electric signals travel when propagating along the electronic arrangement may be reliably decoupled from the thermal path along which heat can be removed from the one on more electronic components towards an environment of the electronic arrangement.

In an embodiment, the second electronic device has an opening through which part of the cooling unit (for example heat sink) extends so as to be brought in contact with the first electronic device being mounted on the second electronic device to cover at least part of the opening. For instance, such an embodiment is shown in FIG. 1 to FIG. 4. In such a configuration, the first electronic device may be attached to one main surface of the second electronic device, the latter having a central opening (in particular through hole) which may be closed partially or entirely by the attached first electronic device. In order to establish a reliable heat removal path from the first electronic device to the cooling unit (for example heat sink), the cooling unit may be guided partially through the opening in the second electronic device and may thus be brought in direct physical contact with the first electronic device. In such a configuration, one main surface of the first electronic device may be connected to both the heat sink and the second electronic device. This architecture offers an excellent thermal performance in combination with a highly compact design. Preferably, an external castellated edge may be foreseen in the first electronic device and may surround the opening extending through the second electronic device.

In an embodiment, the first electronic device is arranged between the second electronic device and the cooling unit (for example heat sink). For instance, such an embodiment is shown in FIG. 5 to FIG. 11. For example, one main surface of the first electronic device may be connected to the heat sink, whereas the opposing other main surface of the first electronic device may be connected to the second electronic device. Hence, the electric signals may travel on one side of the first electronic device, whereas heat can be removed along the other side of the first electronic device.

In an embodiment, the second electronic device has at least one opening into which at least part of at least one surface mounted electronic component of the first electronic device extends. Still referring to the previously described embodiment, one or more surface mounted electronic components (such as connectors, shunts, etc.) of the first electronic device may protrude beyond its carrier board at the main surface of the carrier board at which the first electronic device is connected with the second electronic device. For this purpose, one or more openings (in particular through holes or blind holes) may be foreseen at the carrier board of the second electronic device through which the surface mounted components of the first electronic device may be guided. This ensures a compact design of the electronic arrangement and short electric connection paths.

In an embodiment, the electrically conductive contact structure is configured for electrically coupling the electric contacts at the castellated edge of one of the first electronic device and the second electronic device with horizontal electrically conductive traces of the other one of the first electronic device and the second electronic device. Such an electric connection between vertical electric contacts at the castellated edge of one electronic device and horizontal electrically conductive traces or pads of the other electronic device may be accomplished by merely applying a dot of flowable connection medium (such as solder material) to an interface between the vertical electric contacts and the horizontal traces.

In an embodiment, the first electronic device is a power board and the second electronic device is a capacitor board, in particular of an electronic arrangement being configured for supplying electric energy to an electric motor. Such an electronic arrangement may provide an inverter function, and in particular a three-phase inverter function for an electric engine. The first electronic device, configured as power board, may comprise embedded and/or surface mounted power semiconductor chips, such as field effect transistor chips, providing a switching function in terms of the inverter operation. The second electronic device, configured as capacitor board, may comprise embedded and/or surface mounted passive capacitor components cooperating with the power board.

In an embodiment, the at least one component comprises at least one power component and a driver component. For instance, power components may be semiconductor power components, such as transistor chips (which may for instance be field effect transistor chips and/or bipolar transistor chips) or diode chips. The driver component may be a logic chip or a controller chip for controlling the power components. At least part of the mentioned components may be active chips.

In an embodiment, the at least one component comprises at least one passive component. Hence, in addition to the at least one active chip, one or more passive components, such as capacitances, ohmic resistances, inductances, etc., may be provided.

Active components may be elements or devices which are capable of providing or delivering energy to the circuit (for instance a transistor). Passive components may be devices which do not require any external source for the operation and are capable of storing energy in the form of voltage or current in the circuit (for example a capacitance).

Preferably, a respective carrier board comprises a printed circuit board. In other embodiments, the carrier board comprises a metal plate or a leadframe. However, it is also possible that the carrier board comprises a stack composed of a central electrically insulating and thermally conductive layer (such as a ceramic layer) covered on both opposing main surfaces by a respective electrically conductive layer (such as a copper layer or an aluminium layer, wherein the respective electrically conductive layer may be a continuous or a patterned layer). In particular, the carrier board may be a Direct Copper Bonding (DCB) substrate or a Direct Aluminium Bonding (DAB) substrate. However, the carrier board may also be configured as Active Metal Brazing (AMB) substrate.

Preferably, at least one electronic component is a power semiconductor chip. For instance, a corresponding power semiconductor application may be realized by the chip(s), wherein integrated circuit elements of such a power semiconductor chip may comprise at least one transistor (in particular a field effect transistor such as a MOSFET (metal oxide semiconductor field effect transistor) or a bipolar transistor such as an IGBT (insulated gate bipolar transistor)), at least one diode, etc. It is also possible that the at least one electronic component comprises a controller circuit, a driver circuit, etc. One or more of these and/or other circuits may be integrated into one semiconductor chip, or separately in different chips. In particular, electronic devices or arrangements fulfilling a half-bridge function, a full-bridge function, etc., may be manufactured. In another embodiment, the at least one electronic component may be a logic die.

In an embodiment, the electronic device or arrangement is configured as power converter, in particular one of an AC/DC power converter and a DC/DC power converter. However, also other electronic applications, such as inverters, etc., may be possible.

As substrate or wafer for the semiconductor chips, a semiconductor substrate, in particular a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching, laser removal), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the Figures, some general considerations will be summarized based on which exemplary embodiments have been developed.

An electric circuit which may be used for a drive application is a three phase inverter comprising three MOSFET half bridges suppling electrical energy to an electrical motor. An example of a drive application is an electrical scooter. Conventionally, an inverter board for such a system may be a build-up using an FR4- or IMS-based PCB and discrete components such as power MOSFETs and passive components. In this case, manufacturers have to create their own individual inverter solution customized towards the specific need and system requirements for a respective application. A chip manufacturer may provide discrete components which are used to build-up a customized system solution. Such an approach is cumbersome.

According to exemplary embodiments, it may be possible to provide a full or partial system solution which can be fitted as a whole into a final application, such as an electrical scooter, to supply electric energy to the electric motor. Such an approach has the advantage of a reduced design and development effort for an inverter, or another electronic application, which may lead to a faster development time.

Advantageously, corresponding electronic devices and an electronic arrangement according to exemplary embodiments may use one or more castellated edges (which may be exterior castellated edges and/or castellated holes, i.e. interior castellated edges) of a respective carrier board (in particular for substituting at least part of SMD terminals). In particular interior castellated edges may have the advantage of providing ultra-short electric connection paths, thereby keeping ohmic losses as well as thermal load small and signal quality high. Moreover, this may advantageously reduce energy consumption. When combining the approach of one or more castellated edges with an embedding architecture in which at least one electronic component is embedded in a cavity of a metal inlay (such as a leadframe) being integrated, in turn, in a carrier board of an electronic device, excellent properties in terms of thermal, mechanical and electrical performance may be achieved.

Preferably, it may be possible to arrange two carrier boards of two stacked electronic devices of an electronic arrangement so that the castellations (such as through hole elements with plated top and bottom) do not contact a heat sink or other cooling unit attached to one of the electronic devices for heat removal purposes. In an embodiment, it may also be possible to embody castellations or a castellated edge in a blind via architecture, i.e. not being connected on one side.

More specifically, an exemplary embodiment relates to an electronic arrangement configured as a three-phase MOSFET power apparatus for PCB size reduction via castellated connections.

In an embodiment, a first electronic device, which may be configured as power board, with castellated edges may be stacked with a second electronic device, which may be configured as a capacitor board, for instance with a solder connection in between.

In one embodiment, the power board may be soldered on top of the capacitor board. In another embodiment, the power board may be soldered on bottom of the capacitor board.

In embodiments, the capacitor board may have an opening in the center for guiding a cooling unit (for example heat sink) through the opening and for contacting (and thereby thermally coupling) the cooling unit with the power board. Preferably, the heat sink may interface the power board directly. The heat sink may have a surface area which is smaller than a surface area of the power board to keep the heat sink (or any other cooling unit) away from castellations (or a castellated edge) of the power board.

In a preferred embodiment, one or more internal castellations in the capacitor board may be used to interface control signals. Additionally or alternatively, it is also possible to provide one or more internal castellations in the power board. In one embodiment, one or additional openings in the capacitor board may provide additional contact points.

Figure 2:
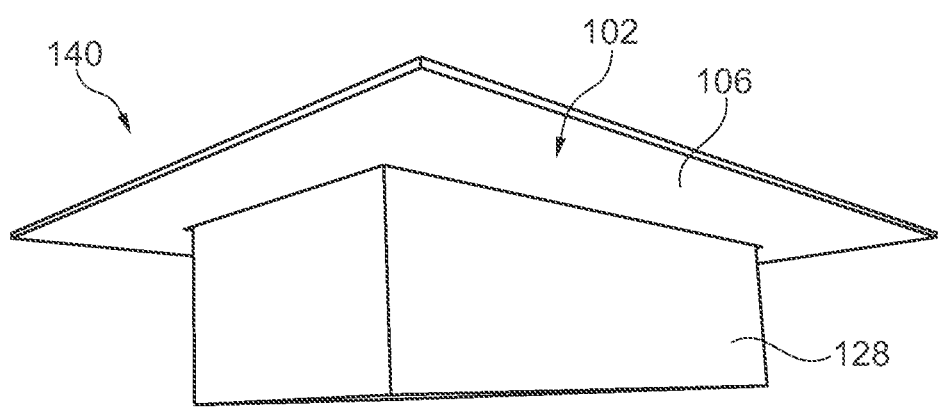
FIG. 2 illustrates another three-dimensional view of the electronic arrangement according to FIG. 1.
Figure 3:
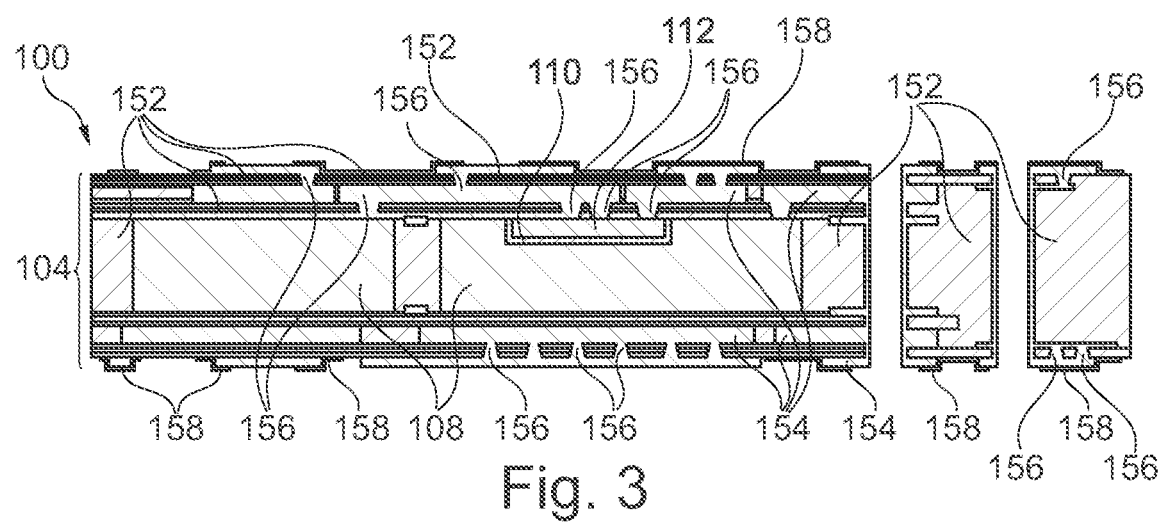
FIG. 3 illustrates a cross-sectional view of a first electronic device of the electronic arrangement according to FIG. 1 and FIG. 2.
Figure 4:
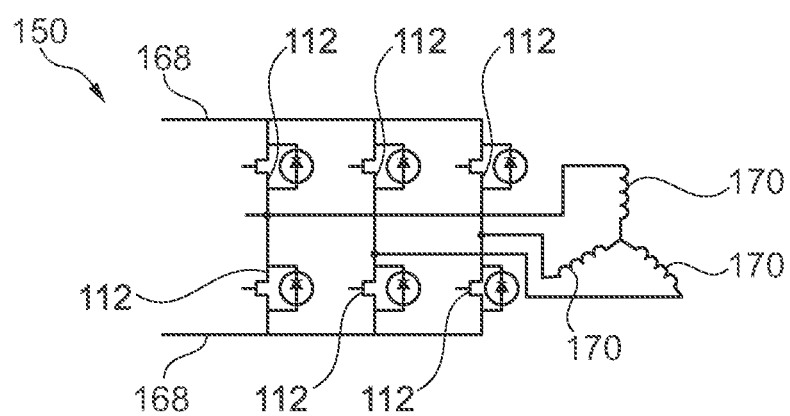
FIG. 4 illustrates a circuit diagram indicating an electronic functionality of the electronic arrangement according to FIG. 1 to FIG. 3.

FIG. 1 illustrates a three-dimensional view of an electronic arrangement 140 according to an exemplary embodiment from a top side, and additionally shows a detail 166 illustrating construction of a castellated edge 119. FIG. 2 illustrates another three-dimensional view of the electronic arrangement 140 according to FIG. 1 from a bottom side. FIG. 3 illustrates a cross-sectional view of a first electronic device 100 of the electronic arrangement 140 according to FIG. 1 and FIG. 2 (without illustrating surface mounted components). FIG. 4 illustrates a circuit diagram 150 indicating an electronic functionality of the electronic arrangement 140 according to FIG. 1 to FIG. 3.

More specifically, the embodiment of FIG. 1 to FIG. 4 relates to an electronic arrangement 140 which comprises a first electronic device 100 and a second electronic device 102. As can be seen in FIG. 1, the first electronic device 100 and the second electronic device 102 are stacked on top of each other. More specifically, the first electronic device 100 is mounted on an upper main surface of the second electronic device 102, for instance by soldering. The mechanical connection between the first electronic device 100 and the second electronic device 102 may also establish an electrically conductive connection in between, as described below in further detail.

The internal construction of the first electronic device 100 is shown in detail in FIG. 3, the external construction is shown in FIG. 1. As shown in the cross-sectional view of FIG. 3, the first electronic device 100 comprises a multi-layer laminate-type carrier board 104 (for instance a six-layer board) with embedded metal inlay 108. As shown, a leadframe-type metal inlay 108 having a cavity 110 is embedded in a laminated layer stack of electrically insulating layers 152 and electrically conductive layers 154 of the carrier board 104. Furthermore, metallic vias 156 establish vertical electric connections in an interior of the carrier board 104. For instance, the electrically insulating layers 152 may be made of FR4, i.e. epoxy resin with glass fibers. The electrically conductive layers 154 and the vias 156 may be made of copper. A top side and a bottom side of the carrier board 104 may be partially covered with solder resist 158. Descriptively speaking, carrier board 104 may be embodied as a printed circuit board with embedded leadframe.

FIG. 3 shows an electronic component 112 which is arranged in a mechanically protected manner inside the cavity 110 of the leadframe-type metal inlay 108. Consequently, the electronic component 112 is also embedded in the carrier board 104. The electronic component 112 may be a semiconductor power chip, such as a MOSFET chip. Although only one electronic component 112 is illustrated in FIG. 3, a plurality of (for instance six) electronic components 112 may be embedded in the carrier board 104. Heat created by the electronic component(s) 112 during operation of the electronic arrangement 140 may be removed by the highly thermally conductive metal inlay 108. It is optionally also possible that pads of the electronic component(s) 112 are electrically coupled by the electrically conductive metal inlay 108 and/or by vias 156. Hence, the described metal inlay 108 may contribute to the mechanical, electrical and/or thermal reliability of the electronic arrangement 140 as a whole.

Although not shown in FIG. 3, the first electronic device 100 may comprise a plurality of surface mounted components, which are shown in FIG. 1. Such surface mounted components may comprise electric connector components 160 and shunt components 162. For instance, the SMD-type connector components 160 may establish an electric connection to capacitors (in particular to provide an input voltage from capacitors) and may be connected, for instance to a capacitor board. For example, each of the (in this example) three connector components 160 may be assigned to a respective one of three phases of an electric motor served by the electronic arrangement 140. Although a plurality of SMD-type shunt components 162 are shown in FIG. 1, they can be omitted in other embodiments (for example when using current phase sensors). Furthermore, electric interface members 164 may be mounted on the upper main surface of the carrier board 104 of the first electronic device 100. For example, the electric interface members 164 can be connected with an optional control board (which can be the capacitor board or a separate board) or gate drivers (not shown).

Carrier board 106 of second electronic device 102 may for instance be an FR4-type printed circuit board (PCB) with a plurality of electronic components 114. As shown in FIG. 1, at least part of the components 114 may be surface mounted on the carrier board 106. Additionally or alternatively, carrier board 106 may comprise one or more embedded components 114 (not shown). For instance, components 114 may be passive components such as capacitor components.

As can be seen in detail 166 in FIG. 1, the carrier board 104 comprises vertical electric contacts 116 at an exterior castellated edge 119 of the carrier board 104. Adjacent to the electric contacts 116, the carrier board 106 comprises horizontal electrically conductive traces 130. By applying an electrically conductive connection medium, such as a solder, to an interface region between the electric contacts 116 and the electrically conductive traces 130, carrier board 104 and carrier board 106 can be electrically coupled via the castellated edge 119. As shown in FIG. 1, the castellated edge 119 is arranged along the entire outer circumference of the carrier board 104, apart from contact-free corners. Again referring to detail 166, the castellated edge 119 comprises a plurality of alternating lateral indentations 122 and lateral protrusions 124. As shown, the electric contacts 116 at the castellated edge 119 of the carrier board 104 are located substantially at the same vertical level as the planar carrier board 104, i.e. at a sidewall thereof. Correspondingly, the electrically conductive traces 130 of the carrier board 106 next to the castellated edge 119 are located substantially at the same vertical level as the planar carrier board 106. Thus, merely mounting planar carrier board 104 on planar carrier board 106 and providing an electrically conductive contact structure (see reference sign 126 in FIG. 13), such as a solder, may establish multiple electric connections between the first electronic device 100 and the second electronic device 102. Hence, the mentioned electrically conductive contact structure 126 may be configured for electrically coupling the electric contacts 116 at the castellated edge 119 of the first electronic device 100 with the horizontal electrically conductive traces 130 of the second electronic device 102.

As best seen in FIG. 2, the electronic arrangement 140 comprises a heat sink 128 which is mounted on a bottom surface of the first electronic device 100 for removing heat created by the component(s) 112. As an alternative to a heat sink 128, another cooling unit may be implemented (for instance an air or water cooling unit). In order to keep the electric connections intact, the heat sink 128 may be mounted on the first electronic device 100 without physical contact with the electric contacts 116 at the castellated edge 119 of the first electronic device 100. For enabling a direct physical contact between first electronic device 100 and heat sink 128, the second electronic device 102 has a central opening in form of a through hole through which part of the heat sink 128 extends. Hence, the second electronic device 102 may be of annular shape. Consequently, the heat sink 128 may directly cool the power board through a cut-out in the capacitor board. As a result, the heat sink 128 is brought in contact with the first electronic device 100 being mounted on the second electronic device 102 to cover the entire opening of the latter.

For designing the carrier board 104, a PCB-based manufacturing process may be implemented. The latter may allow the integration of electronic components 112 (in particular embodied as MOSFETs) via cavities 110 in a leadframe-type metal inlay 108 (which may also comprise one or more metal blocks) into the PCB-based carrier board 104. This may allow to achieve an overall improved system compared to a conventional discrete approach by achieving higher power densities and a superior switching behavior of the inverter. Part of the board area may be used specifically for surface mounted device (SMD) power terminals to interface a further carrier board 106 (which may be denoted as capacitor board).

In the illustrated three-phase MOSFET power inlay arrangement, a PCB size reduction may be achieved in comparison with conventional approaches via the castellated connections. Advantageously, the power board-type first electronic device 100 with castellated edge 119 is soldered on top of the capacitor board-type second electronic device 102 for establishing electric board-to-board connections at the castellated edge 119.

Further advantageously, the capacitor board has an opening in the center for guiding heat sink 128 therethrough and into direct physical contact with the first electronic device 100. As a result, the heat sink 128 interfaces the power board directly, to thereby enable an efficient heat removal in combination with a compact vertical design. Advantageously, the horizontal surface area of the heat sink 128 may be smaller than that of the power board to keep away from the castellations.

Advantageously, the provision of the exterior castellated edge 119 along a major portion of the exterior perimeter of the carrier board 104 may reduce the number of connectors 160 needed for conducting signals within the electronic arrangement 140 and/or between the electronic arrangement 140 and its electronic periphery. Furthermore, the provision of the castellated edge 119 may reduce the PCB-area of the carrier board 104 in a horizontal plane and may thereby render the electronic arrangement 140 more compact and the electric paths shorter.

Now referring to FIG. 4, the electronic arrangement 140 is configured for providing an electronic inverter function. Six electronic components 112 embodied as field effect transistor chips are connected to form three half bridges for converting a direct current (DC) provided between terminals 168 into an alternating current (AC) at three inductors 170 for supplying electric energy to a three-phase AC motor. Descriptively speaking, the first electronic device 100 with its power components 112 functions as a power board and the second electronic device 102 with its passive components 114 functions as a capacitor board for constituting an electronic arrangement 140 being configured for supplying electric energy to an electric motor, for instance of an electrical scooter (not shown). However, other exemplary embodiments may fulfil another electronic function.

Figure 5:
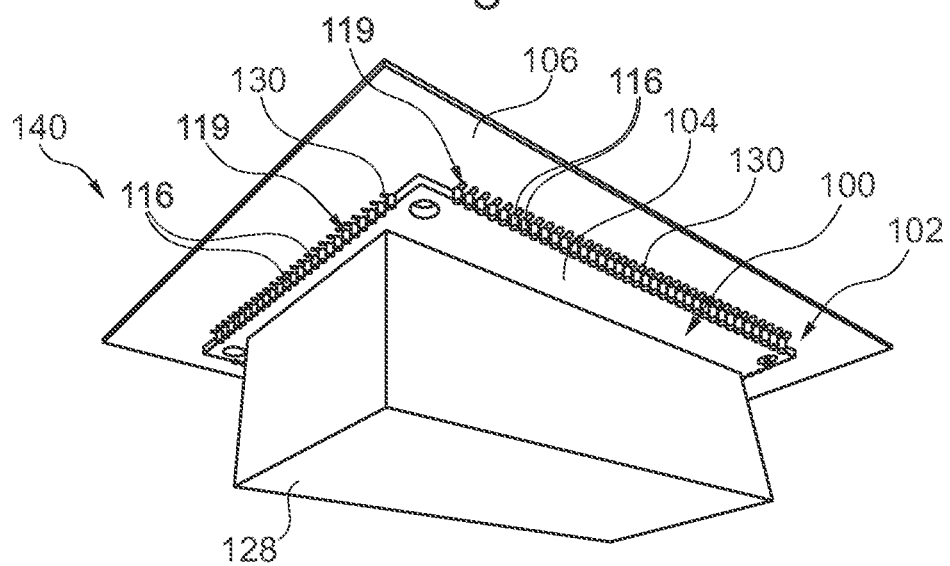
FIG. 5 illustrates a three-dimensional view of an electronic arrangement according to another exemplary embodiment.
Figure 6:
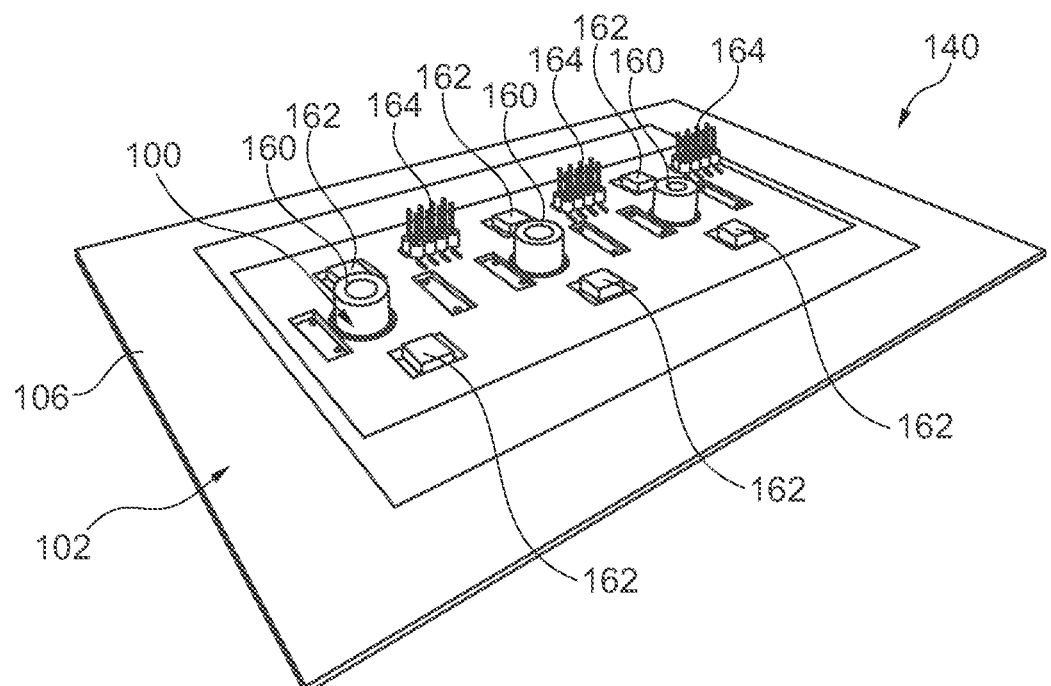
FIG. 6 illustrates another three-dimensional view of the electronic arrangement according to FIG. 5.
Figure 7:
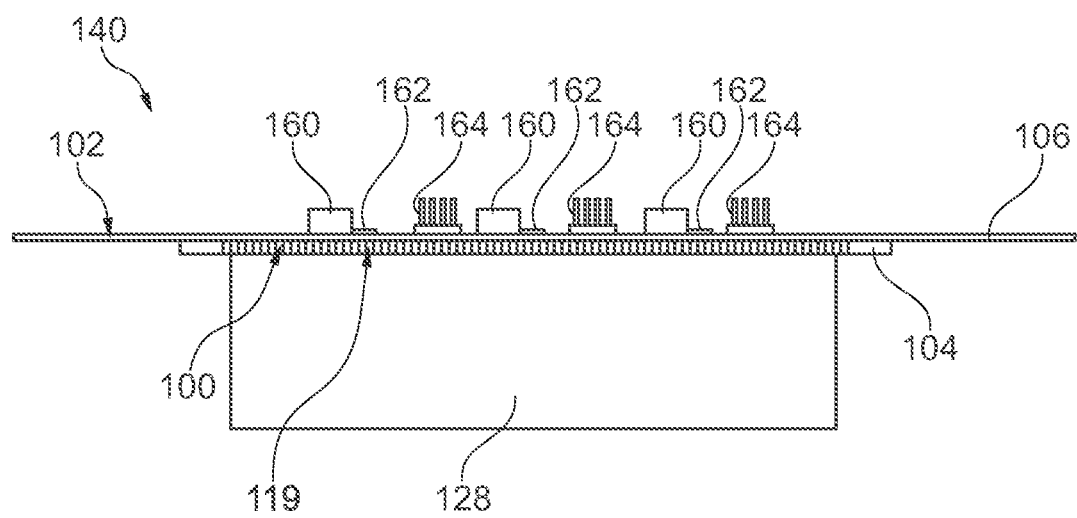
FIG. 7 illustrates a side view of the electronic arrangement according to FIG. 5 and FIG. 6.

FIG. 5 illustrates a three-dimensional view of an electronic arrangement 140 according to another exemplary embodiment from a bottom side. FIG. 6 illustrates another three-dimensional view of the electronic arrangement 140 according to FIG. 5 from a top side. FIG. 7 illustrates a side view of the electronic arrangement 140 according to FIG. 5 and FIG. 6.

Figure 8:
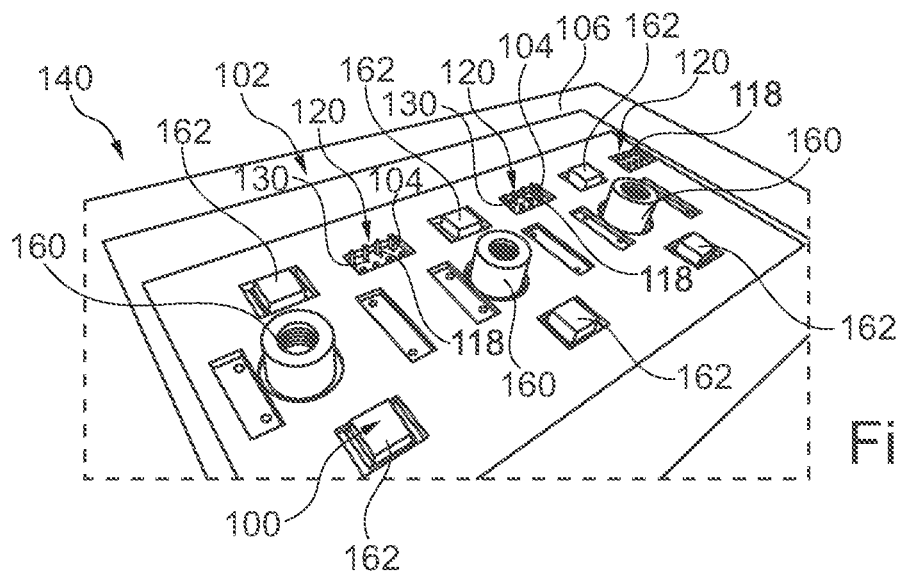
FIG. 8 illustrates a three-dimensional view of an electronic arrangement similar to FIG. 5 to FIG. 7, but having interior castellated edges at a second electronic device.
Figure 9:
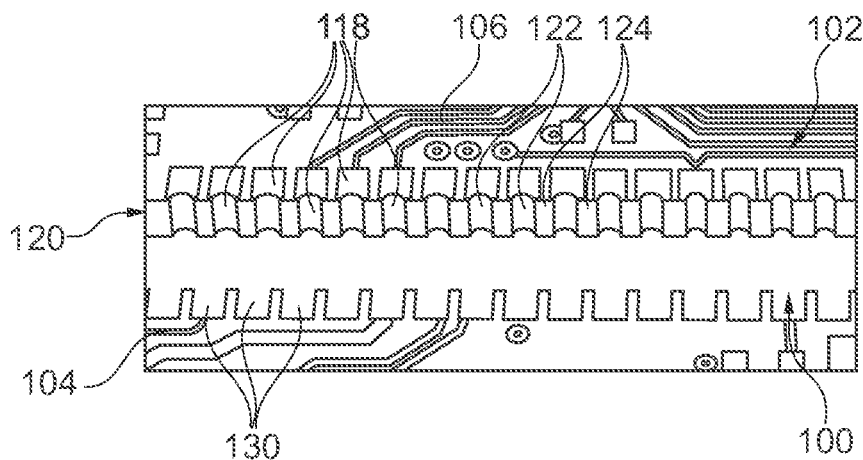
FIG. 9 illustrates a detailed view of an interior castellated edge of the electronic arrangement according to FIG. 8.

FIG. 8 illustrates a three-dimensional view of an electronic arrangement 140 similar to FIG. 5 to FIG. 7, but having interior castellated edges 120 at a second electronic device 102. FIG. 9 illustrates a detailed view of an interior castellated edge 120 of the second electronic device 102 of the electronic arrangement 140 according to FIG. 8.

Many of the features shown in the embodiments of FIG. 5 to FIG. 9 correspond to the embodiment of FIG. 1 to FIG. 4, so that reference is made to the above description for the sake of conciseness. The following description of the embodiments of FIG. 5 to FIG. 9 focuses on differences of these embodiments compared to the previously described embodiment.

In the embodiments according to FIG. 5 to FIG. 9, the second electronic device 102 comprises a carrier board 106 which may be embodied again as a printed circuit board. The passive (in particular capacitor-type) electronic components 114 may be embedded in the flat carrier board 106 and are not shown in FIG. 5 to FIG. 9.

In the embodiment of FIG. 5 to FIG. 9, the first electronic device 100 is sandwiched between the second electronic device 102 and the heat sink 128. In other words, the heat sink 128, the first electronic device 100 and the second electronic device 102 are vertically stacked, wherein the first electronic device 100 is arranged in the center of the device stack. An upper main surface of the first electronic device 100 is connected with a lower main surface of the second electronic device 102. A lower main surface of the first electronic device 100 is connected with the heat sink 128. However, since the first electronic device 100 comprises a plurality of surface mounted components (see reference signs 160, 162, 164 in FIG. 6 and FIG. 7, and reference signs 160, 162 in FIG. 8), the carrier board 106 of the second electronic device 102 is provided with a plurality of small through holes. Each of the surface mounted components 160, 162 (and 164, if present) of the first electronic device 100 is guided through a respective one of said through holes in the second electronic device 102. Hence, the second electronic device 102 has a plurality of openings into which parts of surface mounted electronic components 160, 162 (and 164, if present) of the first electronic device 100 extend. Consequently, a highly compact electronic arrangement 140 can be obtained.

Now referring to the embodiment of FIG. 8 and FIG. 9, the second electronic device 102 comprises electric contacts 118 at interior castellated edges 120 of the carrier board 106. In the shown embodiment, each of the castellated edges 120 is arranged along an inner circumference of a respective opening (which may be a through hole or a blind hole) in the carrier board 106. Hence, the second electronic device 102 is provided with a plurality of interior castellated edges 120 formed along interior openings extending through the carrier board 106. Referring to FIG. 8 and FIG. 9, each of the castellated holes or castellated edges 120 comprises a plurality of alternating lateral indentations 122 and lateral protrusions 124. Each of the indentations 122 is defined by a concavely curved vertical surface area. The protrusions 124 are delimited by a planar vertical dielectric surface area. As shown, the electric contacts 118 are formed at the lateral indentations 122, whereas the lateral protrusions 124 are free of electric contacts 118 and are therefore electrically insulating. However, part of the electric contacts 118 is formed on a vertical surface portion of the castellated edges 120, while another part of the electric contacts 118 is formed on horizontal surface portions of the castellated edges 120.

In the embodiments according to FIG. 5 to FIG. 9, an electric connection between the first electronic device 100 and the second electronic device 102 is accomplished by the exterior castellated edge 119 of the first electronic device 102 (which may be configured and connected as or similar as in FIG. 1 to FIG. 4) and—in the embodiment of FIG. 8 and FIG. 9—additionally by the interior castellated edges 120 (configured and connected as shown in FIG. 9) of the second electronic device 104.

In the embodiments of FIG. 5 to FIG. 9, the first electronic device 100 or power board with castellated edge 119 may be soldered on the bottom of the second electronic device 102 or capacitor board. The capacitor board has openings (being smaller than the single opening in the embodiment of FIG. 1 to FIG. 4) for allowing top side surface mounted components 160, 162 (and 164, if present) of the power board to extend through the openings. Also according to FIG. 5 to FIG. 9, the heat sink 128 interfaces the power board directly, thereby ensuring an efficient heat removal. Preferably, a surface area of the heat sink 128 is smaller than a surface area of the power board to keep the heat sink 128 away from the castellations of the castellated edge 119.

Instead of using header connectors to interface an additional gate driver board (not shown) or the like, internal castellations in the capacitor board are foreseen as interior castellated edges 120 according to FIG. 8 and FIG. 9. The interior castellated edges 120 can be used, for example, to interface control signals. For instance, it is possible to fit a gate driver circuitry in the capacitor board.

Figure 10:
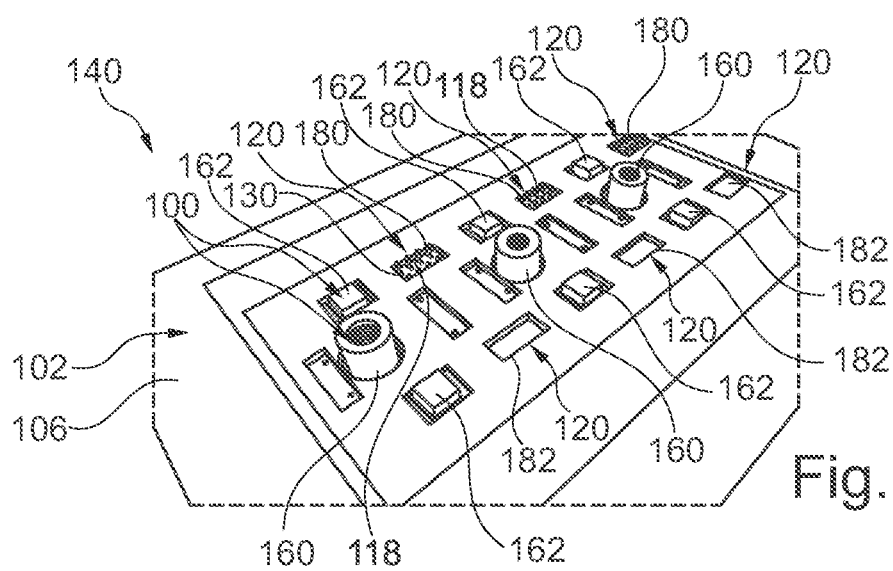
FIG. 10 illustrates a three-dimensional view of an electronic arrangement according to still another exemplary embodiment.
Figure 11:
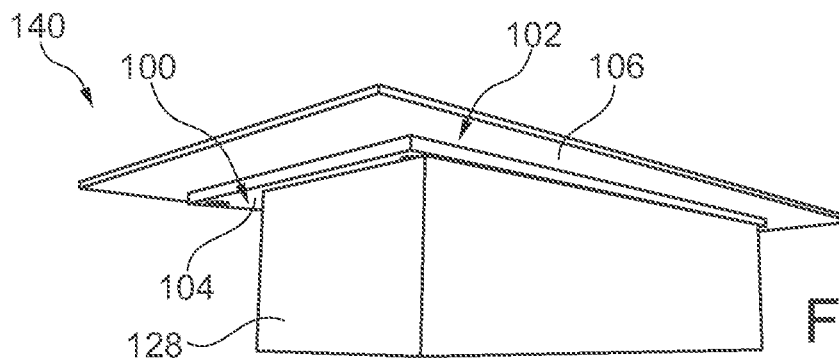
FIG. 11 illustrates another three-dimensional view of the electronic arrangement according to FIG. 10.

FIG. 10 illustrates a three-dimensional view of an electronic arrangement 140 according to still another exemplary embodiment from a top side. FIG. 11 illustrates another three-dimensional view of the electronic arrangement 140 according to FIG. 10 from a bottom side. The embodiment of FIG. 10 and FIG. 11 is similar to the embodiment of FIG. 8 and FIG. 9, so that reference is made to the above description. In the following, differences between said embodiments will be mentioned.

According to FIG. 10 and FIG. 11, the first electronic device 100 does not have a castellated edge 119, i.e. does not have electric contacts 116 at its exterior vertical sidewalls. In other words, no castellations are present on the power board edge according to FIG. 10 and FIG. 11, so that the heat sink 128 can be of the same size as or can be even bigger than the power board. Thus, the embodiment of FIG. 10 and FIG. 11 can be constructed with an excellent thermal performance.

However, the second electronic device 102 of the embodiment of FIG. 10 and FIG. 11 has a large plurality of interior castellated edges 120. Thus, additional openings on the capacitor board provide additional contact points according to FIG. 10 and FIG. 11. Since enough contact points may be provided in this manner, the edge castellations on the power board may be omitted. In regions denoted with reference signs 180, signal connections may be created, so that corresponding internal castellations may be connected for signal transmission. In regions denoted with reference signs 182, power connections may be created, so that corresponding internal castellations may be connected to transfer electric power (for instance relating to the supply of direct current).

Consequently, the embodiment of FIG. 10 and FIG. 11 assign all castellations to the capacitor board, none to the power board. Also a separate control board (not shown) can be provided with interior and/or exterior castellated edges.

As in FIG. 5 to FIG. 9, the heat sink 128 interfaces the power board directly also in the embodiment of FIG. 10 and FIG. 11.

Figure 12:
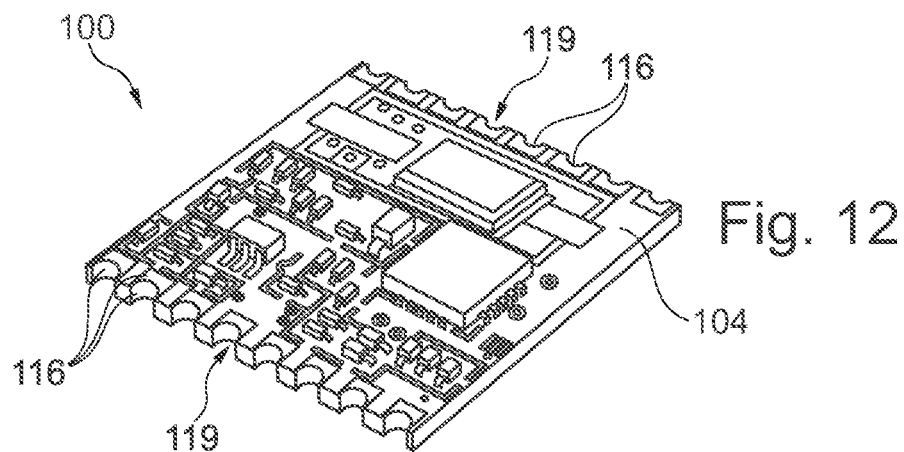
FIG. 12 illustrates a three-dimensional view of an electronic device for an electronic arrangement according to an exemplary embodiment.
Figure 13:
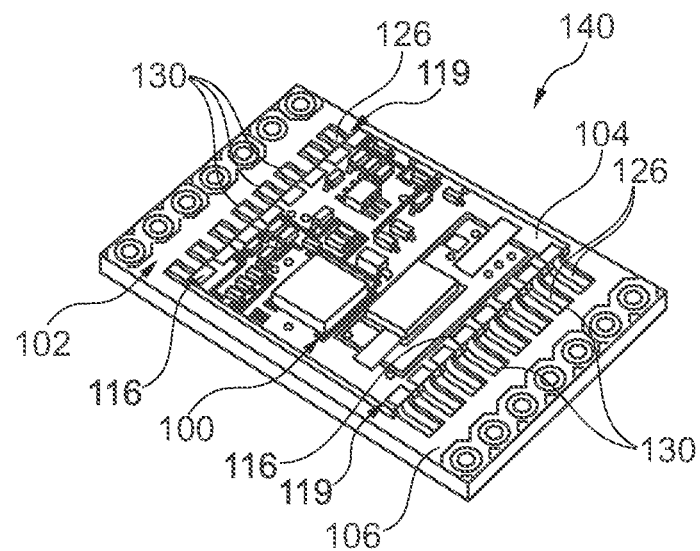
FIG. 13 illustrates a three-dimensional view of an electronic arrangement with the electronic device according to FIG. 12 mounted on another electronic device.

FIG. 12 illustrates a three-dimensional view of a first electronic device 100 for an electronic arrangement 140 according to an exemplary embodiment. FIG. 13 illustrates a three-dimensional view of said electronic arrangement 140 with the first electronic device 100 according to FIG. 12 mounted on a second electronic device 102.

In particular, FIG. 13 shows an electrically conductive contact structure 126, embodied as a solder structure, electrically coupling electric contacts 116 at castellated edges 119 on two opposing sides of the carrier board 104 of the first electronic device 100 with horizontal traces 130 on an upper main surface of carrier board 106 of second electronic device 102.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An electronic device, wherein the electronic device comprises:
    a carrier board having an upper major surface and an opposing lower major surface;
    a metal inlay having a cavity and being arranged in the carrier board;
    at least one electronic component arranged at least partially in the cavity and embedded completely within the carrier board between the upper major surface and the opposing lower major surface; and
    electric contacts at a castellated edge of the carrier board, wherein the castellated edge comprises a plurality of alternating lateral indentations and lateral protrusions extending along a circumference of the carrier board apart from electric contact-free corners of the carrier board, the electric contacts disposed in the lateral indentations and extending vertically from the upper major surface to the lower major surface of the carrier board, one or more electric contacts at the castellated edge are electrically connected to the at least one electronic component.

2. The electronic device according to claim 1, wherein at least part of the castellated edge is arranged along at least part of an outer circumference of the carrier board.

3. The electronic device according to claim 1, wherein at least part of the castellated edge is arranged along at least part of an inner circumference of an opening in the carrier board.

4. The electronic device according to claim 1, comprising at least one of the following features:
    wherein the indentations comprise a curved vertical surface area, in particular a concavely curved vertical surface area;
    wherein the protrusions comprise a planar vertical surface area;
    wherein the electric contacts are formed at least part of the lateral indentations;
    wherein at least parts of the lateral protrusions are free of the electric contacts.

5. The electronic device according to claim 1, wherein at least part of the electric contacts is formed on a vertical surface portion of the castellated edge.

6. The electronic device according to claim 1, wherein the at least one electronic component comprises at least one of a group consisting of at least one power component, in particular at least one semiconductor power chip, at least one active component, and at least one passive component, in particular at least one capacitor component.

7. The electronic device according to claim 1, comprising at least one of the following features:

the electronic device is configured for providing or contributing to an electronic inverter function;

wherein the electric contacts at the castellated edge are located substantially at the same vertical level as the carrier board;

wherein the carrier board is a printed circuit board, in particular an Insulated Metal Substrate-based printed circuit board.

8. An electronic arrangement, comprising:
a first electronic device; and
a second electronic device;
wherein the first electronic device and the second electronic device are stacked on each other; and
wherein at least one of the first electronic device and the second electronic device is configured as an electronic device according to claim 1.

9. The electronic device according to claim 5, wherein another part of the electric contacts is formed on only one or on both opposing horizontal surface portions of the castellated edge.

10. The electronic arrangement according to claim 8, comprising an electrically conductive contact structure electrically coupling the electric contacts at the castellated edge.

11. The electronic arrangement according to claim 8, comprising a cooling unit, in particular a heat sink, mounted on the first electronic device.

12. The electronic arrangement according to claim 8, wherein the first electronic device is a power board and the second electronic device is a capacitor board, in particular of an electronic arrangement being configured for supplying electric energy to an electric motor.

13. The electronic arrangement according to claim 10, wherein the electrically conductive contact structure is a solder structure.

14. The electronic arrangement according to claim 10, wherein the electrically conductive contact structure is configured for electrically coupling the electric contacts at the castellated edge of one of the first electronic device and the second electronic device with horizontal electrically conductive traces of the other one of the first electronic device and the second electronic device.

15. The electronic arrangement according to claim 11, wherein the cooling unit is mounted on the first electronic device without physical contact with the electric contacts at the castellated edge of the first electronic device.

16. The electronic arrangement according to claim 11, wherein the second electronic device has an opening through which part of the cooling unit extends so as to be in contact with the first electronic device being mounted on the second electronic device to cover at least part of the opening.

17. The electronic arrangement according to claim 11, wherein the first electronic device is arranged between the second electronic device and the cooling unit.

18. The electronic arrangement according to claim 17, wherein the second electronic device has at least one opening into which at least part of at least one surface mounted electronic component of the first electronic device extends.

* * * * *